Feb. 17, 1959 A. J. RADCLIFFE, JR., ET AL 2,874,312

TRANSISTOR LIMITER AMPLIFIER

Filed April 4, 1955

United States Patent Office 2,874,312
Patented Feb. 17, 1959

2,874,312

TRANSISTOR LIMITER AMPLIFIER

Arthur J. Radcliffe, Jr., La Grange, and Arthur R. Denz, Chicago, Ill., assignors to International Telephone and Telegraph Corporation, New York, N. Y., a corporation of Maryland Application April 4, 1955, Serial No. 498,913

10 Claims. (Cl. 307—88.5)

This invention relates to a transistor limiter amplifier and more particularly to an arrangement which permits the current flow in the emitter diode of a transistor to be driven to cutoff by the input signals without a potential which opposes the direct current bias being developed across condensers in the input circuit path. Its object is to provide a satisfactory amplifier employing transistors for use between a carrier transmission line and a frequency discriminator. The received signals, which are frequency-modulated, may vary in signal strength, while the signals to the descriminator must be at a constant amplitude.

Heretofore it has been common practice to use vacuum tubes in limiter amplifiers. In many situations, it is desirable to use transistors instead of vacuum tubes because of such advantages as reduced space and power requirements.

Amplitude limiting is obtained by driving the transistors to cutoff and saturation current flow. When current in the emitter diode is cutoff for a portion of each cycle, the input signals are partially rectified, resulting in a net charge accumulating on any condensers in the input circuit path. Discharge of the condensers through resistance in the circuit is relatively slow. Therefore a potential is developed which opposes the direct-current bias supplied to the emitter diode, permitting input signal current to flow during only a small portion of each cycle, and thereby producing unsymmetrical output signals. If the input signal level drops, output is blocked until the condenser charge is reduced sufficiently.

An operative amplifier may be obtained in which the transistor is cutoff for part of a half cycle of the input signal current, if the other half cycle is clipped, as by saturation in a previous stage, and the bias is properly adjusted, so as to obtain a symmetrical wave form of current flow in the emitter diode. But with such an arrangement the bias must be independently adjusted for each stage, optimum gain is not obtained at the optimum bias for symmetrical clipping, and if there is a wide range of input signal strength satisfactory operation is not obtained.

According to the invention, a compensating diode is used to prevent the accumulation of a bias-opposing charge across condensers in the input circuit path. The compensating diode and the emitter diode are oppositely directed in parallel paths with respect to the emitter bias direct current source.

In one form of the invention, input signals are supplied through a transformer; direct-current bias flows from the power supply through a resistor, the secondary of the transformer, and the emitter diode; a condenser bypasses the power supply and resistor for flow of input signals; and the compensating diode is connected across the bypass condenser.

In another form of the invention, the compensating diode is connected directly between the emitter and base terminals of the transistor. A resistor may be used in series with the compensating diode to compensate for the base resistance of the transistor. Input signals may be supplied through a coupling condenser or a transformer.

The foregoing and other objects and features of this invention and the manner of attaining them will become more apparent and the invention itself will be best understood, by reference to the following description of an embodiment of the invention taken in conjunction with the accompanying drawings comprising Figs. 1 to 3, wherein.

Figure 1:
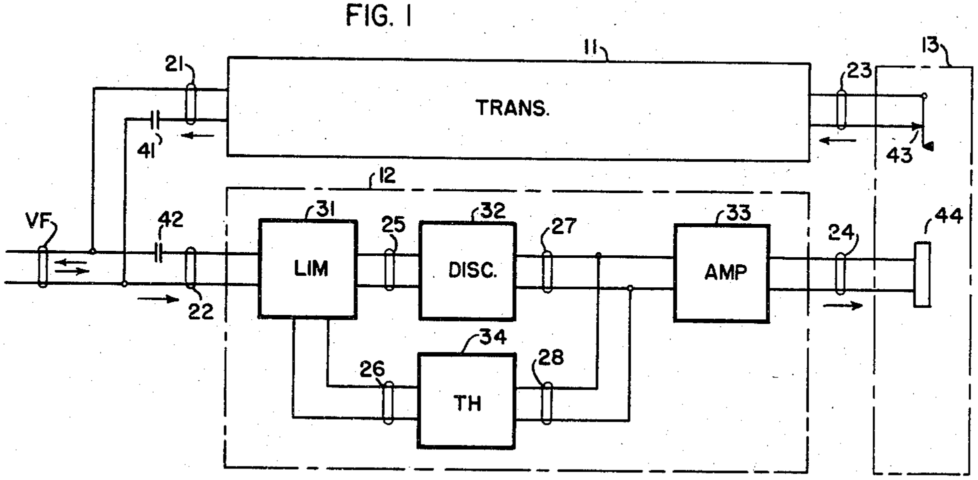
Fig. 1 shows telegraph terminal apparatus connecting a voice-frequency carrier transmission line to a D. C. teletypewriter.

*Fig. 1—general arrangement*

The telephone terminal apparatus comprising a transmitting section 11 and a receiving section 12 coupled between a voice frequency line VF and D. C. teletypewriter 13 as shown in Fig. 1 illustrates one arrangement in which the invention may be used.

During transmission direct current signals at send contacts 43 of teletypewriter 13 are coupled over line 23 to transmitting section 11. The signals are converted to frequency-shift voice-frequency signals, and are then coupled over line 21, through condenser 41, to line VF.

Signals received from line VF, and also from line 21 for home copy, are connected through condenser 42 and line 22 to receiving section 12. The signals are amplified with amplitude limiting in limiter 31 to produce constant amplitude signals at line 25. Discriminator 32 converts the voice frequency signals from line 25 to D. C. signals on line 27. The D. C. signals are amplified by amplifier 33 and connected over line 24 to operate the receiving select magnet 44 of teletypewriter 13.

If the input signals on line 22 are at a low level, signals proportional to input are obtained from limiter 31 at line 26 to a threshold circuit 34. When the input signals are below a given threshold value, output from threshold circuit 34 on line 28 controls the input of amplifier 33 to prevent operation by signals from line 27, and maintain the normal quiescent current flow on line 24.

Figures 2, 3:
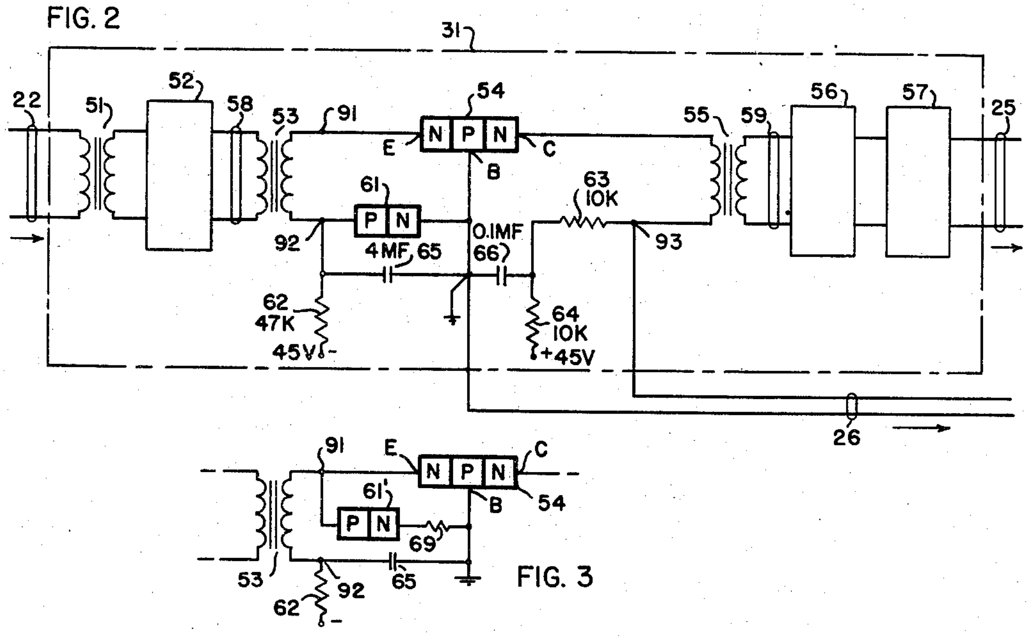
Fig. 2 shows the limiter amplifier with one stage shown in circuit detail.
Fig. 3 shows an alternate method of connecting the compensating diode.

*Fig. 2—limiter amplifier*

The limiter amplifier 31 is shown in detail in Fig. 2. Frequency-modulated signals, which may vary widely in amplitude, are received on line 22 and coupled through transformer 51 to the first stage 52. The limiter amplifier includes three grounded-base transistor amplifier stages 52, 54, and 56, with transformer 53 coupling stage 52 to stage 54, and transformer 55 coupling stage 54 to stage 56. A grounded collector transistor amplifier stage 57 is used to couple stage 56 to line 25. It is required that signals to line 25 have a constant amplitude, and it is desirable that they have a symmetrical square wave shape. Signals for operation of the threshold circuit are taken from stage 54 over line 26. For low level input signals on line 22 up to a strength exceeding the desired threshold value, signals on line 26 must be proportional to the input signals, and therefore in this range amplifiers 52 and 54 must have linear operation.

It is desired that each of the stages 52, 54, and 56 have optimum gain for low level signals, and provide clipping with symmetrical output for higher level signals.

The transistors used are preferably of the junction type, which have a grounded-base current amplification factor, alpha, slightly less than unity.

The amplifier stage 54 is shown in circuit detail. The emitter direct-current bias is supplied from the negative 45-volt source through resistor 62 and the secondary of transformer 53. Collector direct-current bias is supplied from the positive 45-volt source through resistors 64 and 63 and the primary of transformer 55. Condenser 65 bypasses the power supply and resistor 62 in the input circuit path, and condenser 66 bypasses the power supply and resistor 64 in the output circuit path.

Assume that diode 61 is not in the circuit. With input signals such that the peak A. C. current through the secondary of transformer 53 and the emitter diode of transistor 54 does not exceed the emitter D. C. bias current; during half cycles in which the A. C. potential is negative at point 91 with respect to point 92 and the instantaneous emitter electron current flow is increased, electron charge is drawn from condenser 65. During the opposite half cycle the electron charge is returned to condenser 65. Therefore the average D. C. potential at point 92 remains constant. The output signal current from the collector diode and transformer 55 increases as the input signal current increases.

With higher-level input signals at which the peak of the A. C. signal exceeds the D. C. bias; during the half cycle in which the A. C. potential is negative at point 91 with respect to point 92 and the instantaneous emitter current flow increases, electron charge is drawn from condenser 65 as above. During the opposite half cycle in which the instantaneous current flow is decreased, current flow is blocked in the emitter diode for a part of the half cycle, and less lectron charge is returned to the condenser than was drawn therefrom. Therefore, condenser 65 accumulates a positive charge, and after a number of cycles point 92 becomes charged to a positive potential near the positive peak potential of the alternating current signals. Condenser 65 discharges slowly through ressitor 62 and the power supply. Signal current flows in the emitter diode only during a small part of the cycle, resulting in very unsymmetrical output current in the collector diode and transformer 55. The output contains a reduced amount of energy of the desired fundamental frequency. If the input signal level drops, output is blocked until the bypass condenser discharges to the input level.

It is possible to prevent the development of this antibias potential during input signal levels at which the negative half cycle is clipped by blocking in the emitter diode, if the positive half cycle is clipped by saturation in the collector diode of the preceding stage. But then the bias must be carefully adjusted in the individual stages, and the best bias for symmetrical clipping is not that required for optimum gain. In the first stage the range of input signals allowable for satisfactory operation in very limited.

According to the invention, the diode 61 is used between point 92 and ground, in parallel with condenser 65. With respect to the emitter D. C. bias source, diode 61 and the emitter diode of transistor 54 are oppositely directed in parallel paths. During half cycles of the input signals in which the A. C. potential of point 91 is negative with respect to point 92, current flows through diode 61 and the secondary of transformer 53 to the emitter diode of transistor 54. During the opposite half cycle the current may flow to condenser 65. Any positive charge on condenser 65 will be quickly drained off through diode 61. The desired average D. C. potential is maintained at point 92. The full input signal current, clipped as desired, is obtained in the emitter diode. Saturation current may be obtained in the collector diode to clip the positive half cycle. Therefore it may be seen that the amplifier may be adjusted for optimum gain and linear operation with low level signals, and as the signal strength is increased the amplitude will be limited and reach a maximum constant value. The principal output from stage 54 is through transformer 55 to line 59 and the next stage 56, and output for the threshold circuit is taken between point 93 and ground to line 26.

*Fig. 3—alternate connection of diode*

In Fig. 3 an alternate connection for amplifier stage 54 is shown in which a diode 61′ is shown connected between point 91 and ground. During low level signals current flow through diode 61′ is negligible, and current flow in the emitter diode of transistor 54 is as described above. With high level input signals which exceed the D. C. bias, during the portion of the cycle in which current flow is blocked in the emitter diode of transistor 54, current flows in diode 61′. Therefore, current flow in the secondary of transistor 53 and condenser 65 is the same for each half cycle, and the potential at point 92 is maintained at the desired average D. C. value. A small resistor 69 may be used in series with diode 61′ to compensate for the base resistance of transistor 54 and maintain a constant input impedance.

Figure 4:
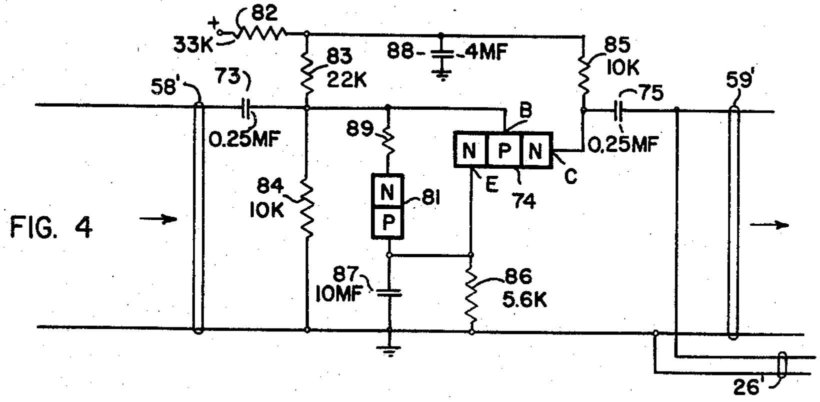
Fig. 4 shows one stage of the limiter amplifier in an alternate form.

*Fig. 4—alternate form of limiter amplifier*

Fig. 4 shows the invention applied to a grounded emitter amplifier stage with condenser coupling. D. C. bias flows from a positive source through resistors 82, 83 and 84 to ground; with collector bias taken from the junctions of resistors 82 and 83 through resistor 85; and emitter bias taken from the junctions of resistors 83 and 84 through the emitter diode of transistor 74, and thence through resistor 86 to ground. Condenser 87 is used to bypass resistor 86 in the input circuit path, and condenser 88 is used in the output circuit path. Input signals on line 58′ are coupled through condenser 73 to the base terminal of transistor 74, and output signals from the collector terminal are coupled through condenser 75 to line 59′, and also to line 26 for the threshold circuit.

Without the diode 81, with high level input signals which result in clipping in the emitter diode of transistor 74, a charge will accumulate on coupling condenser 73 and bypass condenser 87 which would oppose the input signals and result in signal current flow during only a small part of each cycle. According to the invention, the diode 81 is connected in parallel opposition to the emitter diode of transistor 74. Input signal current flows through the emitter diode of transistor 54 or through diode 61′, as in the circuit of Fig. 3 Resistor 89 compensates for the base resistance of transistor 74. While we have described above the principles of our invention in connection with specific apparatus, it is to be clearly understood that this description is made only by way of example and not as a limitation to the scope of our invention.

We claim:

1. A transistor limiter amplifier comprising a transistor including an emitter diode, a collector diode, and a common base member, with emitter, collector, and base terminals connected to the respective members, a bias resistor, emitter bias supply current means for driving a direct current through the bias resistor and the forward direction of the emitter diode in series, collector bias supply current means for driving a direct current through the collector diode, a signal source of alternating current signals, a condenser, a signal input circuit path excluding the bias resistor and including the emitter diode and the condenser in series, means coupling the signal source to the signal input circuit path, an output circuit path through the collector diode which substantially blocks current flow in its reverse direction, a compensating diode connected in opposed polarity in shunt of the emitter diode, at least with respect to the emitter bias supply current means, to compensate for the rectifying action of the emitter diode during a high input signal-current flow which is in excess of the normal bias current, whereby the resulting tendency of the bias potential to then reverse in polarity is substantially eliminated.

2. A transistor limiter amplifier according to claim 1, wherein the said condenser and the said bias resistor are connected in parallel paths with respect to the said signal source, and the said coupling means is a transformer.

3. A transistor limiter amplifier according to claim 2, wherein the said compensating diode is connected in shunt of the said condenser with respect to the said signal source.

4. A transistor limiter amplifier according to claim 2, wherein the said compensating diode is connected in shunt of the said emitter diode with respect to the said signal source.

5. In a transistor limiter amplifier according to claim 4, a resistor in series with the said compensating diode.

6. A transistor limiter amplifier according to claim 2, wherein the said base terminal is grounded.

7. A transistor limiter amplifier according to claim 1, wherein the said compensating diode is connected in shunt of the said emitter diode with respect to the said signal source.

8. In a transistor limiter amplifier according to claim 7, a resistor connected in series with the said compensating diode.

9. A transistor limiter amplifier according to claim 7, wherein the said coupling means is a condenser.

10. A transistor limiter amplifier according to claim 9, wherein the said coupling condenser is connected to the said base terminal.

References Cited in the file of this patent

UNITED STATES PATENTS

| | | |
|---|---|---|
| 2,693,568 | Chase | Nov. 2, 1954 |
| 2,693,572 | Chase | Nov. 2, 1954 |
| 2,708,720 | Anderson | May 17, 1955 |
| 2,716,729 | Shockley | Aug. 30, 1955 |
| 2,759,142 | Hamilton | Aug. 14, 1956 |
| 2,771,584 | Thomas | Nov. 20, 1956 |
| 2,786,964 | Witt et al. | Mar. 26, 1957 |